(12) United States Patent
Ryan et al.

(10) Patent No.: US 9,076,792 B2
(45) Date of Patent: Jul. 7, 2015

(54) MULTI-LAYER BARRIER LAYER STACKS FOR INTERCONNECT STRUCTURES

(71) Applicant: GLOBALFOUNDRIES Inc., Grand Cayman (KY)

(72) Inventors: Vivian W. Ryan, Berne, NY (US); Xunyuan Zhang, Albany, NY (US); Paul R. Besser, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/287,533

(22) Filed: May 27, 2014

(65) Prior Publication Data

US 2014/0264876 A1    Sep. 18, 2014

Related U.S. Application Data

(60) Division of application No. 13/770,026, filed on Feb. 19, 2013, now Pat. No. 8,772,158, which is a continuation-in-part of application No. 13/553,977, filed on Jul. 20, 2012, now Pat. No. 8,728,931.

(51) Int. Cl.
| | |
|---|---|
| *H01L 23/48* | (2006.01) |
| *H01L 23/52* | (2006.01) |
| *H01L 23/532* | (2006.01) |
| *H01L 21/02* | (2006.01) |
| *H01L 23/538* | (2006.01) |
| *H01L 23/00* | (2006.01) |
| *H01L 21/768* | (2006.01) |

(52) U.S. Cl.
CPC .... *H01L 23/53209* (2013.01); *H01L 21/02697* (2013.01); *H01L 23/5384* (2013.01); *H01L 23/53238* (2013.01); *H01L 2924/0002* (2013.01); *H01L 23/562* (2013.01); *H01L 21/76886* (2013.01); *H01L 21/76846* (2013.01); *H01L 21/76858* (2013.01); *H01L 21/76873* (2013.01)

(58) Field of Classification Search
USPC .................. 257/751, E21.584, 761, E23.145, 257/E23.161, 762
See application file for complete search history.

(56) References Cited

U.S. PATENT DOCUMENTS

| | | | |
|---|---|---|---|
| 6,207,558 | B1 | 3/2001 | Singhvi et al. |
| 6,534,865 | B1 | 3/2003 | Lopatin et al. |
| 6,740,221 | B2 | 5/2004 | Cheung et al. |
| 8,017,523 | B1 | 9/2011 | Wu et al. |
| 8,247,030 | B2 | 8/2012 | Suzuki et al. |
| 8,319,208 | B2 | 11/2012 | Sorenson et al. |

(Continued)

OTHER PUBLICATIONS

Office Action from related U.S. Appl. No. 13/554,020 dated Jun. 19, 2014.

*Primary Examiner* — Chuong A Luu
*Assistant Examiner* — Cory Eskridge
(74) *Attorney, Agent, or Firm* — Amerson Law Firm, PLLC

(57) ABSTRACT

A semiconductor device includes a recess defined in a dielectric layer and an interconnect structure defined in the recess. The interconnect structure includes a first barrier layer lining the recess, the first barrier layer including an alloy of tantalum and a first transition metal other than tantalum, wherein a first interface between the first barrier layer and the dielectric layer has a first stress level. A second barrier layer is positioned on the first barrier layer, the second barrier layer including at least one of tantalum and tantalum nitride, wherein a second interface between the second barrier layer and the first barrier layer has a second stress level that is less than the first stress level. The interconnect structure further includes a fill material substantially filling the recess.

20 Claims, 7 Drawing Sheets

(56) References Cited

U.S. PATENT DOCUMENTS

| | | |
|---|---|---|
| 2002/0024142 A1 | 2/2002 | Sekiguchi |
| 2003/0085470 A1 | 5/2003 | Hasunuma |
| 2005/0054191 A1* | 3/2005 | Yu et al. .................. 438/629 |
| 2005/0272254 A1 | 12/2005 | Ding et al. |
| 2006/0071350 A1 | 4/2006 | Fan et al. |
| 2008/0296768 A1 | 12/2008 | Chebiam et al. |
| 2010/0085801 A1 | 4/2010 | Sorenson et al. |
| 2010/0200991 A1 | 8/2010 | Akolkar et al. |
| 2011/0017499 A1 | 1/2011 | Yang et al. |
| 2012/0001330 A1 | 1/2012 | Huisinga et al. |
| 2012/0077053 A1 | 3/2012 | Akolkar et al. |
| 2012/0228771 A1 | 9/2012 | Edelstein et al. |

* cited by examiner

MULTI-LAYER BARRIER LAYER STACKS FOR INTERCONNECT STRUCTURES

CROSS-REFERENCE TO RELATED APPLICATION

This is a divisional of co-pending application Ser. No. 13/770,026, filed Feb. 19, 2013, which was a continuation-in-part of application Ser. No. 13/553,977, filed Jul. 20, 2012.

BACKGROUND OF THE INVENTION

1. Field of the Invention

The disclosed subject matter relates generally to the field of semiconductor device manufacturing, and more particularly, to a multi-layer barrier layer stack for an interconnect structure.

2. Description of the Related Art

A conventional integrated circuit device, such as a microprocessor, is typically comprised of many thousands of semiconductor devices, e.g., transistors, formed in and above the surface of a semi-conductive substrate. For the integrated circuit device to function, the transistors must be electrically connected to one another through conductive interconnect structures. The back end of line (BEOL) is the second portion of integrated circuit fabrication where the individual devices (transistors, capacitors, resistors, etc.) get interconnected with wiring elements. BEOL generally begins when the first layer of metal is deposited on the wafer. It includes contacts, insulating layers (dielectrics), metal levels, and bonding sites for chip-to-package connections. Many modern integrated circuit devices are very densely packed, i.e., there is very little space between the transistors formed in and above the substrate. Thus, these conductive interconnect structures must be made in multiple layers to conserve plot space on the semiconductor substrate.

The conductive interconnect structures are typically accomplished through the formation of a plurality of conductive lines and conductive plugs, commonly referred to as contacts or vias, formed in alternating layers of dielectric materials formed on the device. As is readily apparent to those skilled in the art, the conductive plugs are means by which various layers of conductive lines, and/or semiconductor devices, may be electrically coupled to one another. The conductive lines that connect the various interconnect structures are commonly formed in trenches defined in the dielectric layers.

A contact is generally used to define an interconnect structure (e.g., using polysilicon or metal) to an underlying polysilicon layer (e.g., source/drain or gate region of a transistor), while a via denotes a metal to metal interconnect structure. In either case, a contact opening or via opening is formed in an insulating layer overlaying the conductive member. A second conductive layer is then formed over the contact or via opening and electrical communication is established with the conductive member.

One technique for reducing the size of the features formed on the semiconductor device involves the use of copper for the lines and interconnections in conjunction with new dielectric materials having lower dielectric constants than previously achievable with common dielectric material choices. Standard dielectric materials such as silicon dioxide, TEOS, and F-TEOS have dielectric constants greater than 3. The new dielectric materials, commonly referred to as low-k dielectrics, have dielectric constants less than 3, and thus, allow greater device densities, due to their more efficient isolation capabilities. One such low-k dielectric is sold under the name of Black Diamond, by Applied Materials, Inc.

Typical interconnect features include a metal stack that is made up of three basic elements: a barrier layer, a seed layer, and bulk fill. The barrier layer serves to inhibit migration or diffusion of copper into the dielectric and also to inhibit oxygen diffusion from the dielectric into the interconnect feature. The seed layer provides a favorable surface to nucleate islets for copper grain growth, improves wettability of copper over the topography to minimize agglomeration, protects the barrier material from attack in the copper plating bath, and provides a dopant material for diffusion into the copper to mitigate electromigration (EM) and stress migration (SM).

In a narrow BEOL pitch, the barrier and seed layers must be relatively thin to accommodate the geometry while leaving enough room for the bulk copper fill. Due to continuous scaling to smaller dimensions, it becomes more difficult to create barrier and seed layers that are capable of performing their functions.

The present disclosure is directed to various methods and devices that may avoid, or at least reduce, the effects of one or more of the problems identified above.

SUMMARY OF THE INVENTION

The following presents a simplified summary of the present disclosure in order to provide a basic understanding of some aspects of the invention. This summary is not an exhaustive overview of the disclosure, nor is it intended to identify key or critical elements of the subject matter disclosed here. Its sole purpose is to present some concepts in a simplified form as a prelude to the more detailed description that is discussed later.

The present disclosure is generally directed to multi-layer barrier layer stacks for interconnect structures that may be used to reduce mechanical stress levels between the interconnect structure and a dielectric material layer in which the interconnect structure is formed. In one illustrative embodiment, a semiconductor device is disclosed that includes a recess defined in a dielectric layer and an interconnect structure defined in the recess. The interconnect structure of the disclosed semiconductor device includes, among other things, a first barrier layer lining the recess, the first barrier layer including an alloy of tantalum and a first transition metal other than tantalum, wherein a first interface between the first barrier layer and the dielectric layer has a first stress level. The interconnect structure of the semiconductor device further includes a second barrier layer positioned on the first barrier layer, the second barrier layer including at least one of tantalum and tantalum nitride, wherein a second interface between the second barrier layer and the first barrier layer has a second stress level that is less than the first stress level. Additionally, the interconnect structure also includes a fill material substantially filling the recess.

In another exemplary embodiment, a semiconductor device is disclosed that includes a dielectric layer and an interconnect structure embedded in the dielectric layer. The embedded interconnect structure includes, among other things, an adhesion barrier layer and a stress-reducing barrier layer positioned above the adhesion barrier layer, wherein the adhesion barrier layer includes an alloy of tantalum and a first transition metal other than tantalum and stress-reducing barrier layer includes tantalum. Furthermore, a first interface between the adhesion barrier layer and the dielectric layer has a first stress level and a second interface between the stress-reducing barrier layer and the adhesion barrier layer has a second stress level that is less than the first stress level. Additionally, the interconnect structure includes an alloy layer positioned above the stress-reducing barrier layer and a fill material positioned above the alloy layer, wherein the alloy layer comprises a second transition metal and at least one material component of at least one of the adhesion barrier layer and the stress-reducing barrier layer.

In a further illustrative embodiment, a semiconductor device is disclosed that includes a dielectric layer and an interconnect structure embedded in the dielectric layer. The interconnect structure includes, among other things, first barrier layer that includes an alloy of tantalum and titanium, wherein a first interface between the first barrier layer and the dielectric layer has a first stress level. Additionally, a second barrier layer that includes one of tantalum and tantalum nitride is positioned above the first barrier layer, wherein a second interface between the second barrier layer and the first barrier layer has a second stress level that is less than the first stress level. The interconnect structure further includes an alloy layer positioned above the second barrier layer, wherein the alloy layer includes ruthenium and at least one of tantalum and titanium, and a fill material including copper that is positioned above the alloy layer.

BRIEF DESCRIPTION OF THE DRAWINGS

The disclosure may be understood by reference to the following description taken in conjunction with the accompanying drawings, in which like reference numerals identify like elements, and in which.

Figure 1:
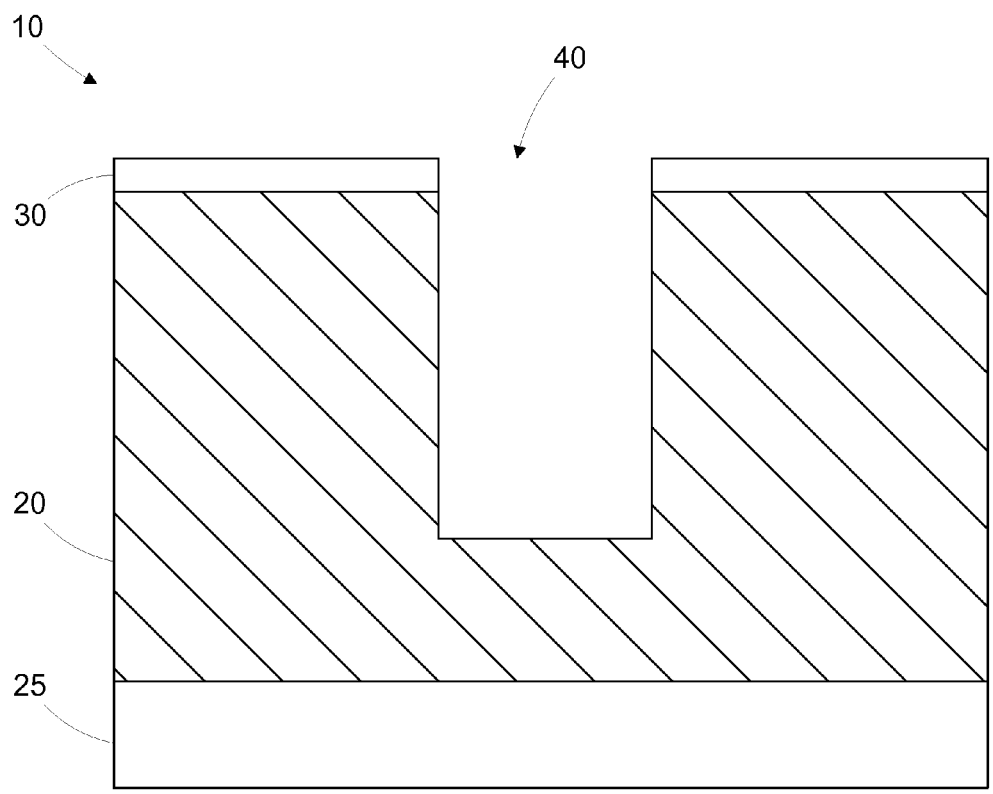
FIG. 1 is a cross section view of a partially completed interconnect structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIGS. 1-7, the disclosed subject matter shall be described in the context of a method for fabricating an interconnect structure. FIG. 1 is a cross-section view of a partially completed interconnect structure 10. A dielectric layer 20 has been provided on a substrate 25. The dielectric layer may represent an interlayer dielectric layer disposed between a device layer or metallization layer and another metallization layer. In one embodiment, the dielectric layer 20 may have a low dielectric coefficient, commonly referred to as a low-k dielectric. One such suitable low-k dielectric material is Black Diamond, offered by Applied Materials, Inc. A hard mask layer 30 is formed to provide a template for etching a recess 40. In the illustrated embodiment, the recess 40 represents a trench in which an interconnect line feature may be formed, however, the methods described herein may also be applied to other types of interconnects, such as via structures or dual damascene trench and via structures, where an underlying metal region is to be contacted by the interconnect feature. Hence, the recess 40 may be a trench, a via opening, or a combined trench and via opening.

Figure 2:
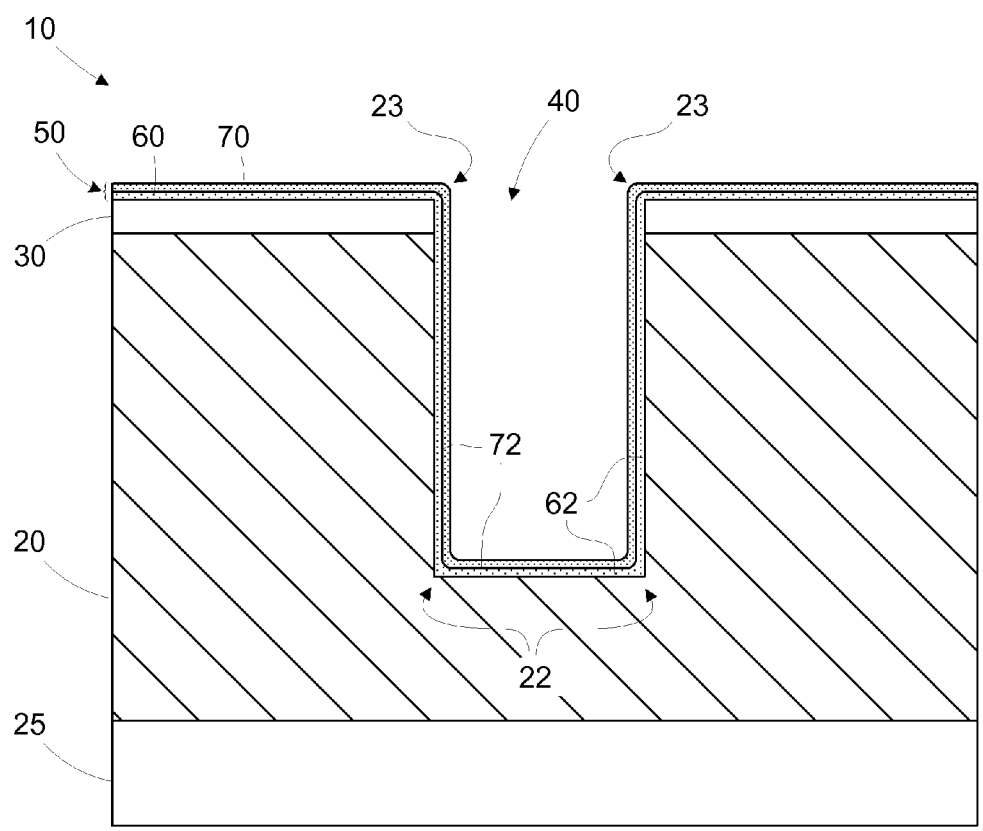
FIG. 2 is a cross-section view of the structure of FIG. 1 illustrating the formation of a barrier layer stack.

As illustrated in FIG. 2, a barrier layer stack 50 may be formed above the dielectric layer 20 so as to line the recess 40. The barrier layer stack 50 may include an adhesion barrier layer 60 and a stress-reducing barrier layer 70 formed above the adhesion barrier layer 60. The adhesion barrier layer 60 is adapted to provide good adhesion between the dielectric layer 20 and the metal interconnect structure 10. In certain embodiments, the adhesion barrier layer 60 may also reduce the overall resistance of the barrier layer stack 50, as well as reduce the likelihood of pipe diffusion in the bulk copper material 110 of the interconnect structure 10 (see, FIGS. 4, 5, 7). In some embodiments, the stress-reducing barrier layer 70 may be adapted to reduce stress in the interconnect structure 10 by reducing the differential stress, or "delta stress," between the metal film stack (which includes the bulk copper fill material 110 plus the barrier layer stack 50 and the seed layer stack 80; see FIGS. 4, 5, 7) and the underlying dielectric layer 20. Delta stress may therefore be defined as the absolute value of the difference between the stress in the metal film stack and the stress in the dielectric layer 20.

In certain exemplary embodiments, the stress-reducing barrier layer 70 may be adapted to reduce an initial stress level that is created across an interface 62 between the adhesion barrier layer 60 and the dielectric layer 20 when the adhesion barrier layer 60 is initially formed Accordingly, due to the stress reduction effect of the stress-reducing barrier layer 70, the initial stress level across the interface 62 may be reduced to a second stress level that is lower than the initial stress level, thereby contributing to an overall reduction in the net delta stress of the interconnect structure 10. Additionally, the stress level present across an interface 72 between the adhesion barrier layer 60 and the stress-reducing barrier layer 70 may also be lower than would otherwise typically be the case had the stress-reducing barrier layer 70 not exhibited the stress reduction effects described herein. As such, the stress level across the interface 72 may therefore be at a third stress level that is less than the second stress level across the interface 62. This lower stress level across the interface 72 also contributes to a general reduction in the net delta stress of the interconnect structure 10.

The stress reduction effect of the stress-reducing layer 70 therefore serves to reduce the stress levels between the adhesion barrier layer 60 and dielectric material 20, as well as between the barrier layers 60 and 70. Moreover, the stress-reducing layer 70 may also reduce the stress levels in some regions of the interconnect structure 10 that, due to geometry considerations, may be more susceptible to stress-related defects, such as at corner regions of the interconnect structure 10—e.g., the corner regions 22 and/or 23, as shown in FIGS. 2-7—and the like. Thus, the stress-reducing barrier layer 70 may reduce the overall stress differential across the substantially the entirety of the interconnect/dielectric interface. Furthermore, the stress-reducing barrier layer 70 may also reduce the likelihood that stress-related fractures may occur in metal layers and/or neighboring dielectric material layers. Moreover, as with the adhesion barrier layer 60, the stress-reducing barrier layer 70 may also serve to reduce the overall resistance of the barrier layer stack 50, as well as to reduce the likelihood of pipe diffusion in the bulk copper material 110 of the interconnect structure 10 (see, FIGS. 4, 5 and 7).

It should be appreciated that the stress levels present in the interconnect structure 10 may be tensile or compressive, depending on the particular application and geometry of the interconnect structure 10, as well as a variety of different device processing parameters, such as types of materials and deposition processes, thermal history, and the like.

In some illustrative embodiments, the material composition used for the adhesion barrier layer 60 may include, for example, tantalum (Ta) and/or tantalum nitride (TaN), which may be formed by performing physical vapor deposition (PVD), chemical vapor deposition (CVD), or atomic layer deposition (ALD) processes known in the art. In such embodiments, the material composition of the stress-reducing barrier layer 70 may include, for example, an alloy of tantalum (Ta) and at least one suitable transition metal (Mx) other than tantalum, which may be formed using a PVD process. Exemplary transition metals that may be used for the TaMx alloy of the stress-reducing barrier layer 70 may include any element (other than tantalum) in the d-block of the periodic table, which includes groups 3 to 12 on the periodic table. For example, in one illustrative embodiment, titanium (Ti) may be used with tantalum (Ta) in the adhesion barrier layer 60 to form a tantalum-titanium alloy (TaTi). Furthermore, in other embodiments, two or more suitable transition metals (Mx) other than tantalum—e.g., chromium (Cr) and zinc (Zn)—which may be used in conjunction with tantalum (Ta) to form the TaMx alloy of the adhesion barrier layer 60—e.g., a TaCrZn alloy. Additionally, in certain embodiments, and whether one or a plurality of transition metals are used, the amount of tantalum (Ta) in the TaMx alloy of the adhesion barrier layer 60 may range from approximately 60-93 wt %, whereas the amount of transition metal (Mx) other than tantalum in the layer 60 may be in the range of around 7-40 wt %.

In other illustrative embodiments, the material composition used for the adhesion barrier layer 60 may include an alloy of tantalum (Ta) and a suitable transition metal (Mx), as previously described above. For example, the transition metals (Mx) that may be used for the TaMx alloy of the adhesion barrier layer 60 may include any non-tantalum element from groups 3 to 12 on the periodic table, such as titanium (Ti) in the case of a TaMx alloy that includes single transition metal other than tantalum, or a combination of chromium (Cr) and zinc (Zn) in the case of a TaMx alloy having at least two transition metals other than tantalum, as noted above. Additionally, also as noted previously, the amount of tantalum (Ta) in the TaMx alloy of the adhesion barrier layer 60 may be approximately 60-93 wt %, and the amount of transition metal (Mx) may be in the range of around 7-40 wt %, irrespective of whether or not the TaMx alloy includes one transition metal or a plurality of transition metals other than tantalum. Furthermore, in those embodiments of the present disclosure wherein the material composition of the adhesion barrier layer includes a TaMx alloy, the material composition of the stress-reducing barrier layer 70 may include at least one of tantalum (Ta) and tantalum nitride (TaN). It should be appreciated, however, that other materials and/or material combinations may also be used for the barrier layer stack 50, provided the selected materials exhibit at least the adhesion and stress-reducing properties of the respective barrier layers 60 and 70 described herein.

Figure 3:
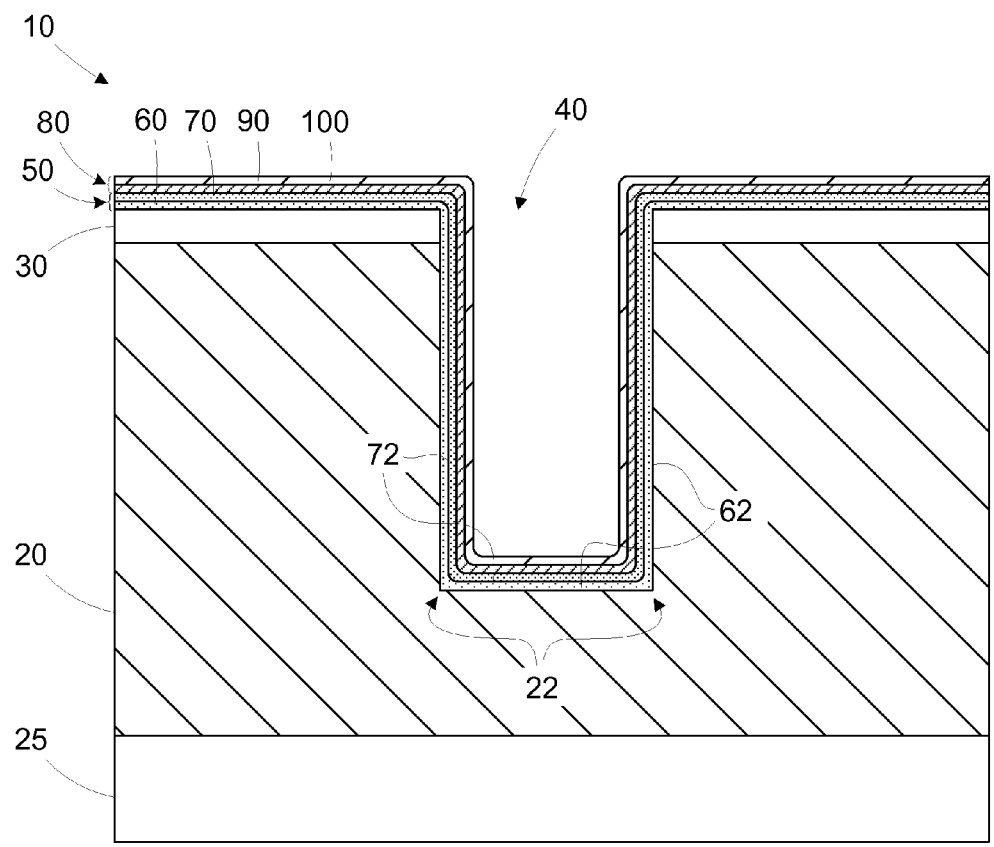
FIG. 3 is a cross-section view of the structure of FIG. 2 illustrating the formation of a seed layer stack.

As illustrated in FIG. 3, a seed layer stack 80 may be formed over the barrier layer stack 50 to line the recess 40. The seed layer stack 80 includes an undoped seed layer 90 and a doped seed layer 100 formed above the undoped seed layer 90. In the illustrated embodiment, the seed layer 90 may be undoped copper, and the doped seed layer 100 may be a copper alloy such as copper-manganese (CuMn). Other alloy metals that may be used for the doped seed layer 100 include, for example, aluminum, gold, calcium, zinc, cadmium, silver, tin, etc.

Figure 4:
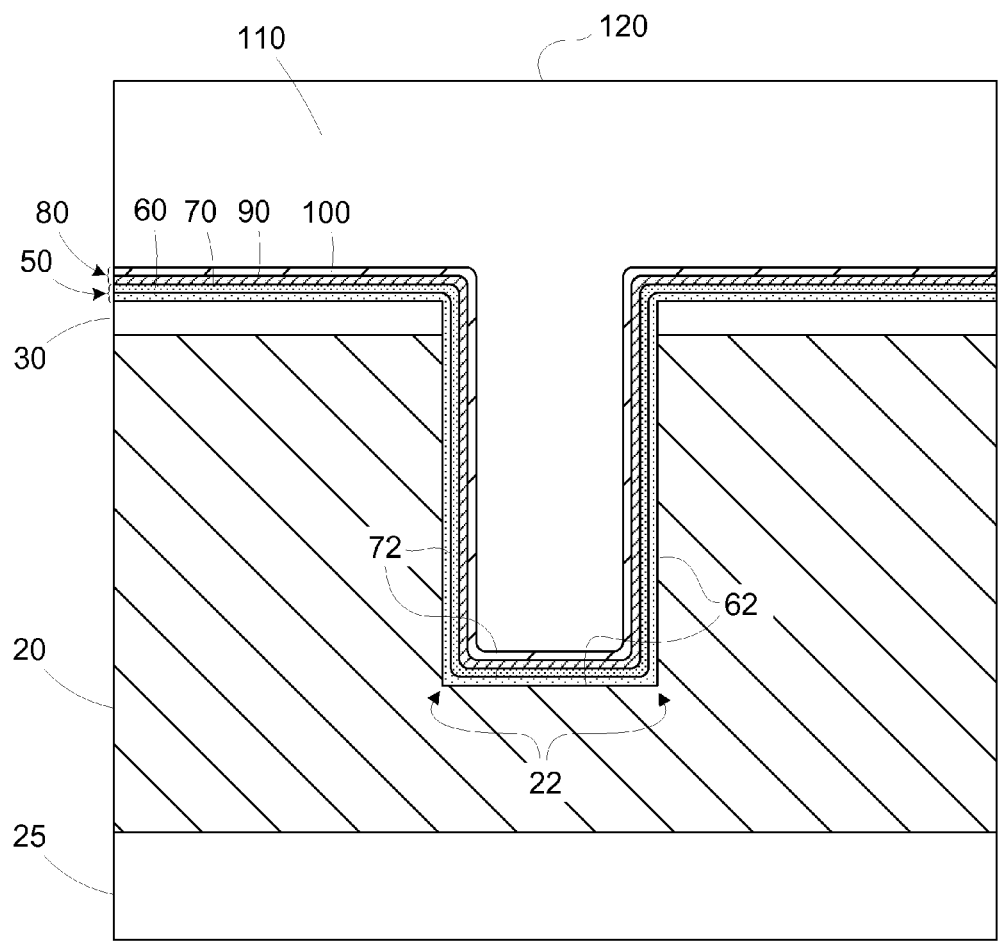
FIG. 4 is a cross-section view of the structure of FIG. 3 illustrating the a copper fill process.
Figure 5:
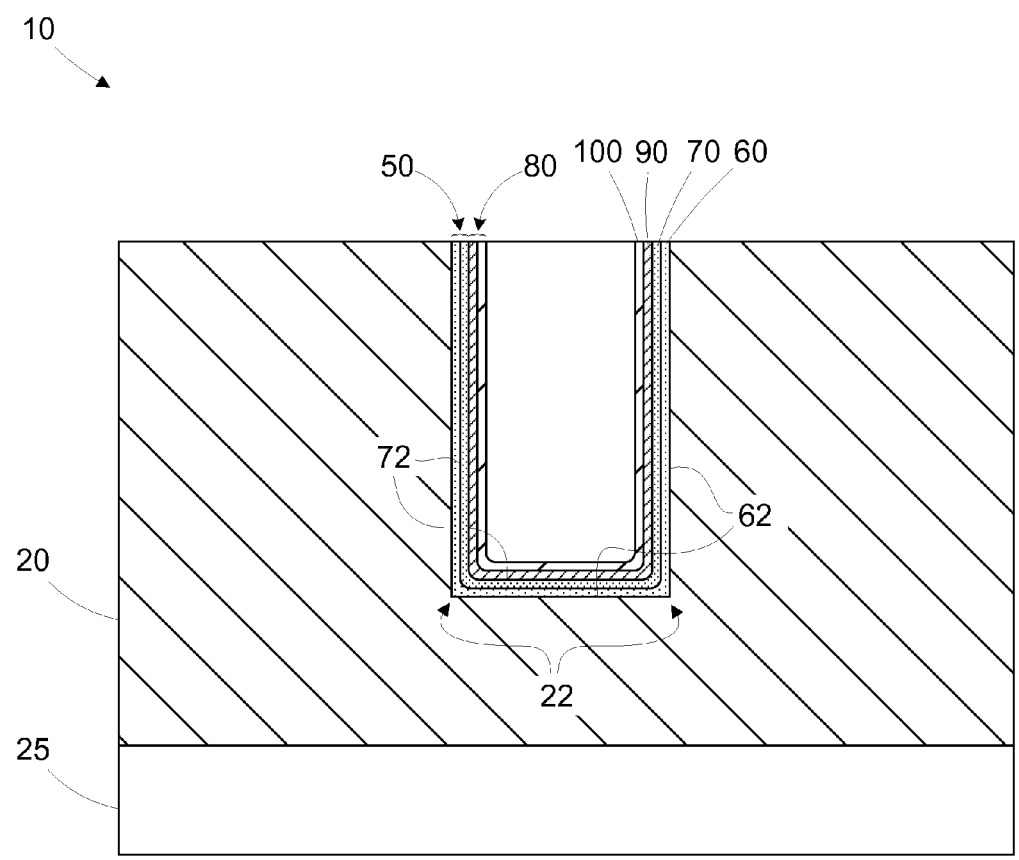
FIG. 5 is a cross-section view of the structure of FIG. 4 illustrating a chemical mechanical polishing (CMP) process.

In the illustrative embodiment of FIG. 4, a bulk copper fill may be performed using an electroplating process or a PVD copper process with reflow to form copper fill layer 110. In other embodiments, an electroless copper plating process or an ALD process may also be used. After the fill process, an anneal process may be performed to realign the grain boundaries and increase the grain size of the copper layer 110. During the anneal process, the dopant in the doped seed layer 100 may diffuse into the copper fill layer 110 and thereby improve its electromigration (EM) and/or stress migration (SM) resistance. In certain embodiments, the dopant tends to migrate to the upper surface 120 of the copper fill layer 110. Some dopant may also diffuse into the undoped seed layer 90, however, the undoped seed layer 90 acts as a buffer to limit dopant diffusion into any dislocations or other crystallographic defects that may be present in the barrier layer stack 50. An exemplary anneal process may be conducted at 100-400° C. for 30-60 min in a nitrogen ambient, or in an ambient that includes a mixture of nitrogen and hydrogen.

Subsequently, a chemical mechanical polishing (CMP) process may be performed to remove excess copper fill material 110. During the polishing process the horizontal portions of the seed layer stack 80, the barrier layer stack 50, and the hard mask layer 30 are removed, resulting in the structure shown in FIG. 5.

Figure 6:
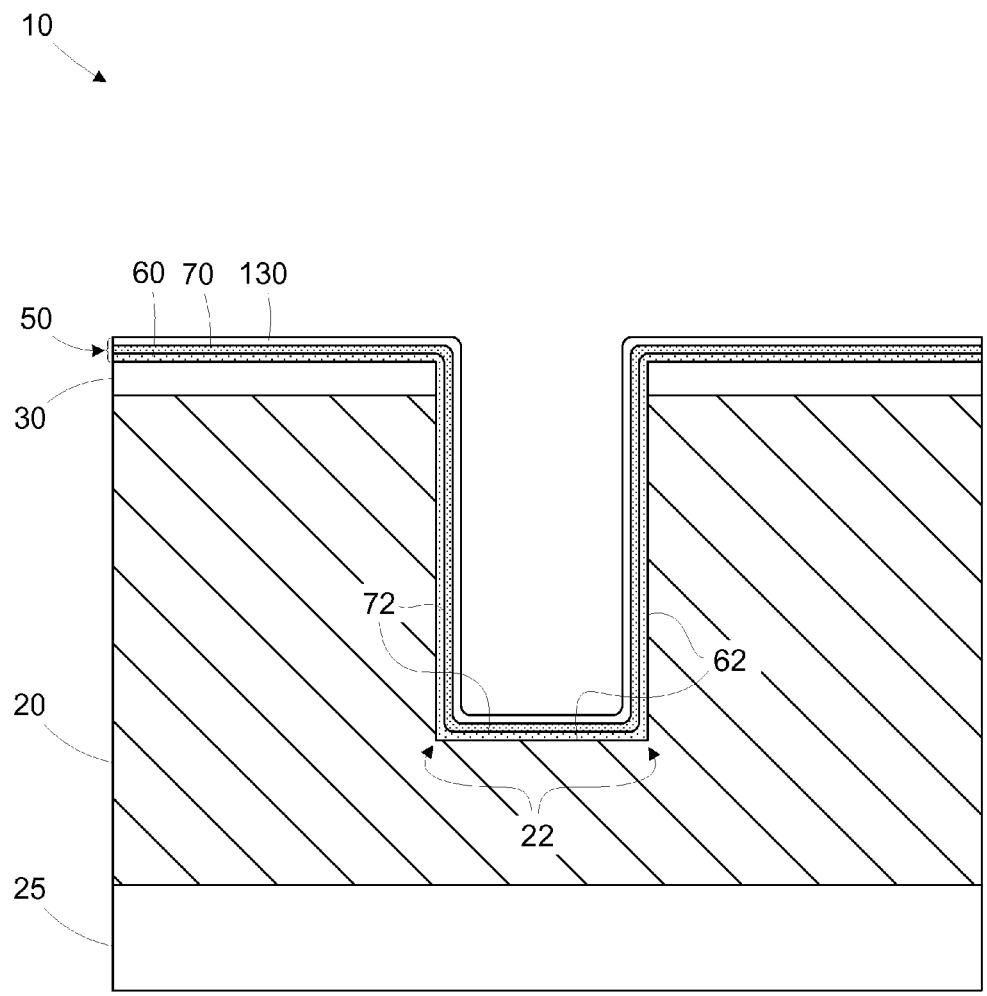
FIG. 6 is a cross-section view of a further illustrative embodiment of the barrier layer stack shown in FIG. 2.

Referring to FIG. 6, an embodiment is illustrated where the barrier layer stack 50 also includes a wetting layer 130. In certain exemplary embodiments, the material of the wetting layer 130 may be, for example, ruthenium (Ru). However, other transition metals having relatively high degrees of wettability for copper may also be used for the wetting layer 130, such as, for example, osmium, rhodium, palladium, platinum, iridium, niobium, and cobalt. The wetting layer 130 may act as a seed enhancement layer to improve the copper seed coverage, thereby enhancing the copper fill. Furthermore, the wetting layer 130 allows direct copper plating of the seed layer stack 80.

Figure 7:
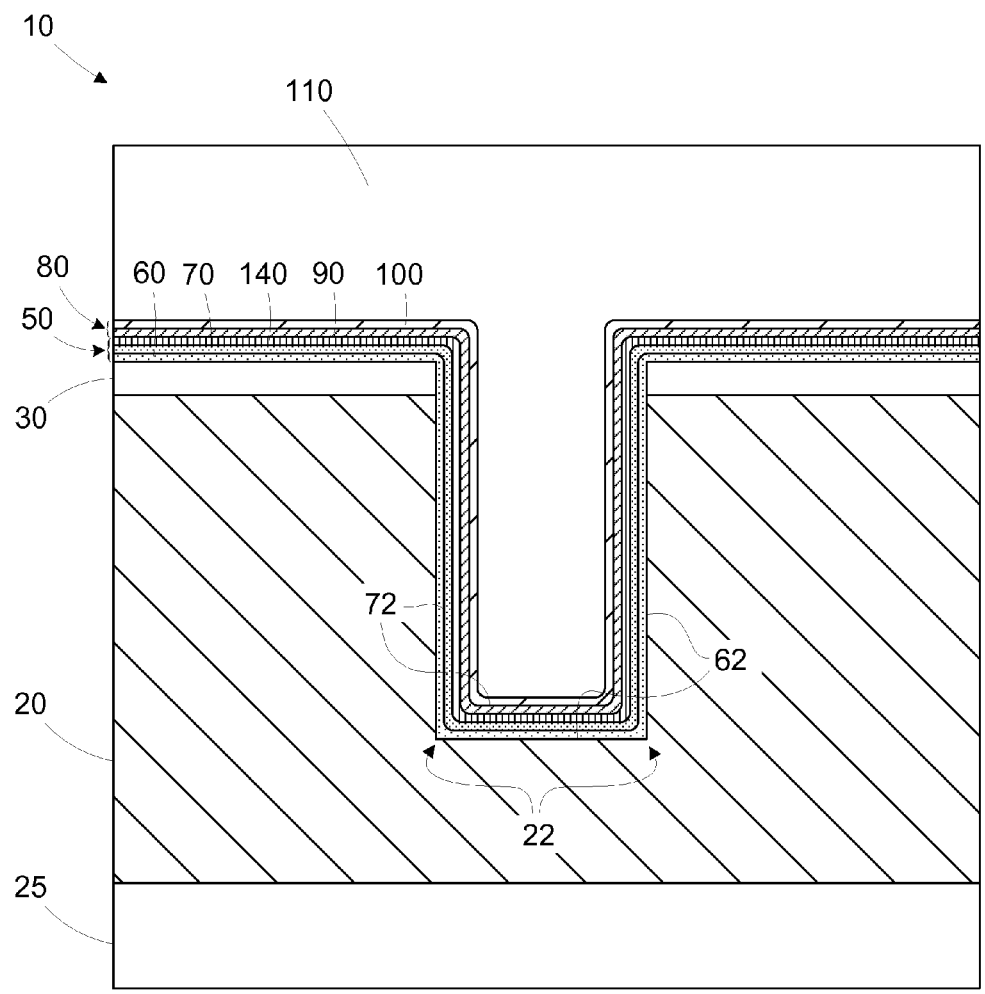
FIG. 7 is a cross-section view of the structure of FIG. 6 after further processing steps have been performed to form an alloy region between the barrier layer stack and a seed layer stack.

As illustrated in FIG. 7, during the anneal process performed after the copper fill layer 110 has been formed, at least one transition metal material component from either or both of the stress-reducing barrier layer 70 and the adhesion barrier layer 60 may diffuse into the wetting layer 130, thereby creating an alloy layer 140, e.g., RuTa and/or RuTi, and the like. For example, in certain embodiments, the specific time and/or temperature parameters of the anneal process may be adjusted so that a transition metal component (e.g., tantalum) of the stress-reducing barrier layer 70—which may be in direct contact with the wetting layer 130—diffuses into the transition metal (e.g., ruthenium) of the wetting layer 130 to form the alloy layer 140 (e.g., RuTa). In other illustrative embodiments, the anneal process parameters may be adjusted so that a transition metal component (e.g., titanium and/or tantalum) of the adhesion barrier layer 60—which may be separated from the wetting layer 130 by at least the stress-reducing barrier layer 70—diffuses into the transition metal (e.g., ruthenium) of the wetting layer 130 to form the alloy layer 140 (e.g., RuTi and/or RuTa). The alloyed composition of the alloy layer 140 serves to change the characteristics of the wetting layer 130 to improve its efficacy as a barrier layer for mitigating electromigration, stress migration, and/or time depend dielectric breakdown (TDDB). This change may increase the overall effectiveness of the barrier layer stack 50, while also providing an advantage during the copper fill process.

The use of the multiple layer barrier layer stack 50 and the seed layer stack 80 as described herein provides process advantages and reliability advantages (i.e., EM and/or SM and/or TDDB resistance). The stress gradient across the interconnect/dielectric interface may be reduced in both the barrier layer stack 50 and the seed layer stack 80.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a recess defined in a dielectric layer;
an interconnect structure defined in the recess, the interconnect structure comprising:
a first barrier layer lining the recess, the first barrier layer comprising an alloy of tantalum and a first transition metal other than tantalum, wherein a first interface between the first barrier layer and the dielectric layer has a first stress level;
a second barrier layer positioned above the first barrier layer, the second barrier layer comprising at least one of tantalum and tantalum nitride, wherein a second interface between the second barrier layer and the first barrier layer has a second stress level that is less than the first stress level; and
a fill material substantially filling the recess.

2. The device of claim 1, wherein the second barrier layer is a stress-reducing barrier layer that is adapted to reduce a stress level at said first interface.

3. The device of claim 1, wherein the first transition metal comprises titanium.

4. The device of claim 1, further comprising a wetting layer positioned between the second barrier layer and the fill material, the wetting layer comprising an alloy comprised of a second transition metal and at least one material component of one of the first and second barrier layers.

5. The device of claim 4, wherein the at least one material component of the first and second barrier layers comprises at least one of tantalum and titanium.

6. The device of claim 4, wherein the second transition metal comprises ruthenium.

7. The device of claim 1, wherein the first barrier layer further comprises a second transitional metal other than tantalum.

8. The device of claim 1, wherein the first barrier layer comprises tantalum in an amount that ranges from 60 wt % to 93 wt % and comprises the first transition metal in an amount that ranges from 7 wt % to 40 wt %.

9. The device of claim 1, wherein the fill material comprises copper.

10. The device of claim 9, wherein the fill material comprises manganese.

11. A semiconductor device, comprising:
a dielectric layer;
an interconnect structure embedded in the dielectric layer, the interconnect structure comprising:
an adhesion barrier layer comprising an alloy of tantalum and a first transition metal other than tantalum, wherein a first interface between the adhesion barrier layer and the dielectric layer has a first stress level;
a stress-reducing barrier layer comprising tantalum positioned above the adhesion barrier layer, wherein a second interface between the stress-reducing barrier layer and the adhesion barrier layer has a second stress level that is less than the first stress level;
an alloy layer positioned above the stress-reducing barrier layer, the alloy layer comprising a second transition metal and at least one material component of at least one of the adhesion barrier layer and the stress-reducing barrier layer; and
a fill material positioned above the alloy layer.

12. The semiconductor device of claim 11, wherein the stress-reducing barrier layer is adapted to reduce a stress level at the first interface.

13. The semiconductor device of claim 11, wherein the first transition metal comprises titanium and the second transition metal comprises ruthenium.

14. The semiconductor device of claim 11, wherein the first transition metal comprises at least one of chromium and zinc.

15. The semiconductor device of claim 11, wherein the stress-reducing barrier layer comprises tantalum nitride.

16. The semiconductor device of claim 11, wherein the alloy layer comprises at least one of tantalum and titanium.

17. The semiconductor device of claim 11, wherein the alloy layer comprises one of osmium, rhodium, palladium, platinum, iridium, niobium, and cobalt.

18. The semiconductor device of claim 11, wherein the fill material comprises copper and one of manganese, aluminum, gold, calcium, zinc, cadmium, silver, and tin.

19. A semiconductor device, comprising:
- a dielectric layer;
- an interconnect structure embedded in the dielectric layer, the interconnect structure comprising:
  - a first barrier layer comprising an alloy of tantalum and titanium, wherein a first interface between the first barrier layer and the dielectric layer has a first stress level;
  - a second barrier layer comprising one of tantalum and tantalum nitride positioned above the first barrier layer, wherein a second interface between the second barrier layer and the first barrier layer has a second stress level that is less than the first stress level;
  - an alloy layer positioned above the second barrier layer, the alloy layer comprising ruthenium and at least one of tantalum and titanium; and
  - a fill material comprising copper positioned above the alloy layer.

20. The semiconductor device of claim 19, wherein the second barrier layer is a stress-reducing barrier layer that is adapted to reduce a stress level at the first interface.

\* \* \* \* \*